(12) United States Patent
Yagyu

(10) Patent No.: US 9,972,598 B2
(45) Date of Patent: May 15, 2018

(54) METHOD OF MANUFACTURING SEMICONDUCTOR DEVICE

(71) Applicant: Renesas Electronics Corporation, Koutou-ku, Tokyo (JP)

(72) Inventor: Yuki Yagyu, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days. days.

(21) Appl. No.: 15/640,493

(22) Filed: Jul. 1, 2017

(65) Prior Publication Data

US 2018/0082977 A1 Mar. 22, 2018

(30) Foreign Application Priority Data

Sep. 16, 2016 (JP) ................. 2016-181845

(51) Int. Cl.
*H01L 21/00* (2006.01)
*H01L 23/00* (2006.01)
(Continued)

(52) U.S. Cl.
CPC .......... *H01L 24/85* (2013.01); *H01L 23/3107* (2013.01); *H01L 23/49513* (2013.01); *H01L 23/49555* (2013.01); *H01L 23/49558* (2013.01); *H01L 23/49582* (2013.01); *H01L 24/05* (2013.01); *H01L 24/45* (2013.01); *H01L 24/48* (2013.01); *H01L 24/78* (2013.01); *H01L 2224/05647* (2013.01); *H01L 2224/45147* (2013.01); *H01L 2224/45687* (2013.01); *H01L 2224/48091* (2013.01); *H01L 2224/48101* (2013.01); *H01L 2224/48245* (2013.01); *H01L 2224/7815* (2013.01); *H01L 2224/78756* (2013.01); *H01L 2224/8502* (2013.01); *H01L 2224/85051* (2013.01); *H01L 2224/85065* (2013.01); *H01L 2224/85075* (2013.01); *H01L 2224/85355* (2013.01); *H01L 2224/85359* (2013.01); *H01L 2224/85898* (2013.01); *H01L 2224/85948* (2013.01); *H01L 2224/85986* (2013.01); *H01L 2924/0541* (2013.01)

(58) Field of Classification Search
None
See application file for complete search history.

(56) References Cited

U.S. PATENT DOCUMENTS

| 7,299,966 B2 | 11/2007 | Nishiura et al. |
| 9,293,436 B2 | 3/2016 | Akiba et al. |
| 2012/0225567 A1* | 9/2012 | Cichocki ........... H01L 21/76849 438/786 |

FOREIGN PATENT DOCUMENTS

| JP | 2004-031686 A | 1/2004 |
| JP | 2015-220248 A | 12/2015 |

* cited by examiner

*Primary Examiner* — Angel Roman
(74) *Attorney, Agent, or Firm* — Shapiro, Gabor and Rosenberger, PLLC

(57) ABSTRACT

Reliability of a semiconductor device is improved.
A wire bonding step includes a step of exposing a wire and a pad electrode to a reducing gas atmosphere, forming a first hydroxyl layer on a surface of a ball portion, and forming a second hydroxyl layer on a surface of the pad electrode, a first bonding step of temporarily joining the ball portion to the pad electrode through the first hydroxyl layer and the second hydroxyl layer, and after the first bonding step, a step of actually joining the ball portion to the pad electrode by performing a heat treatment on a semiconductor chip and a base material.

19 Claims, 13 Drawing Sheets

(51) Int. Cl.
*H01L 23/495* (2006.01)
*H01L 23/31* (2006.01)

METHOD OF MANUFACTURING SEMICONDUCTOR DEVICE

CROSS-REFERENCE TO RELATED APPLICATIONS

The disclosure of Japanese Patent Application No. 2016-181845 filed on Sep. 16, 2016 including the specification, drawings and abstract is incorporated herein by reference in its entirety.

BACKGROUND

The present invention relates to a method of manufacturing a semiconductor device, in particular to a technique effective when applied to a method of manufacturing a semiconductor device having a pad electrode made of copper (Cu) and a bonding wire made of copper (Cu).

Japanese Unexamined Patent Application Publication No. 2004-31686 discloses a technique that enables bonding of a gold wire onto a copper bonding pad even when there is a thick copper oxide film on a surface of the bonding pad by using an initial ball where tin is attached to a tip of the gold wire. Further, Japanese Unexamined Patent Application Publication No. 2004-31686 describes that a wire composed mainly of copper is used instead of the gold wire.

Japanese Unexamined Patent Application Publication No. 2015-220248 discloses a technique that couples a bonding wire with an electrode pad through a first film 12d by removing a native oxide film formed on a surface of the electrode pad and thereafter forming the first film 12d made of a conductive member (chrome, titanium, tungsten, or the like) and coupling a wire to the first film 12d. Japanese Unexamined Patent Application Publication No. 2015-220248 also describes a bonding wire made of copper and an electrode pad made of copper.

SUMMARY

The inventors of the present application study a wire bonding process that bonds a bonding wire composed mainly of copper to a pad electrode composed mainly of copper. For example, a thermo-compression bonding method that uses ultrasonic waves bonds a wire and a pad electrode by removing an oxide film on a surface of the pad electrode by applying ultrasonic waves to a ball formed at a tip of the bonding wire.

However, it is difficult to remove the oxide film formed on the surface of the pad electrode made of copper because the thickness of the oxide film is large and the oxide film is hardly plastic-deformed.

Therefore, it is found that a bonding failure occurs between the bonding wire and the pad electrode and the reliability of the semiconductor device is degraded.

Therefore, it is desired to improve the reliability of the semiconductor device.

The other problems and novel features will become apparent from the description of the present specification and the accompanying drawings.

A method of manufacturing a semiconductor device according to an embodiment includes a step of preparing a semiconductor chip having a pad electrode made of first copper on a main surface of the semiconductor chip, a step of preparing a base material having a chip mounting portion and a lead, a step of mounting the semiconductor chip in the chip mounting portion, and a wire bonding step of coupling the pad electrode and the lead by using a wire which is made of second copper and has a ball portion and a wire portion. The wire bonding step includes a step of exposing the wire and the pad electrode to a reducing gas atmosphere, forming a first hydroxyl layer on a surface of the ball portion, and forming a second hydroxyl layer on a surface of the pad electrode, a first bonding step of joining the ball portion to the pad electrode through the first hydroxyl layer and the second hydroxyl layer, and after the first bonding step, a step of joining the ball portion to the pad electrode by performing a heat treatment on the semiconductor chip and the base material.

According to the embodiment, it is possible to improve the reliability of the semiconductor device.

BRIEF DESCRIPTION OF THE DRAWINGS

FIG. 8C is an atomic-level state diagram of a surface of a ball portion 5a.

FIG. 9A is a cross-sectional view during the "wire bonding" process following FIG. 8a.

FIG. 11A is a cross-sectional view during the "wire bonding" process following FIG. 10a.

DETAILED DESCRIPTION

In the embodiment described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

In the following embodiment, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Further, in the following embodiment, it is needless to say that an element (including an element step etc.) is not necessarily indispensable, except for the case where it is clearly specified in particular and where it is considered to be clearly indispensable from a theoretical point of view, etc.

Similarly, in the following embodiment, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for explaining the embodiment, the same symbol is attached to the same member, as a principle, and the repeated explanation thereof will be omitted. In order to make a drawing intelligible, hatching may be attached even if it is a plan view.

(Embodiment)

In the present embodiment, a QFP (Quad Flat Package) type semiconductor device will be described as an example.

<Semiconductor Device>

Figure 1:
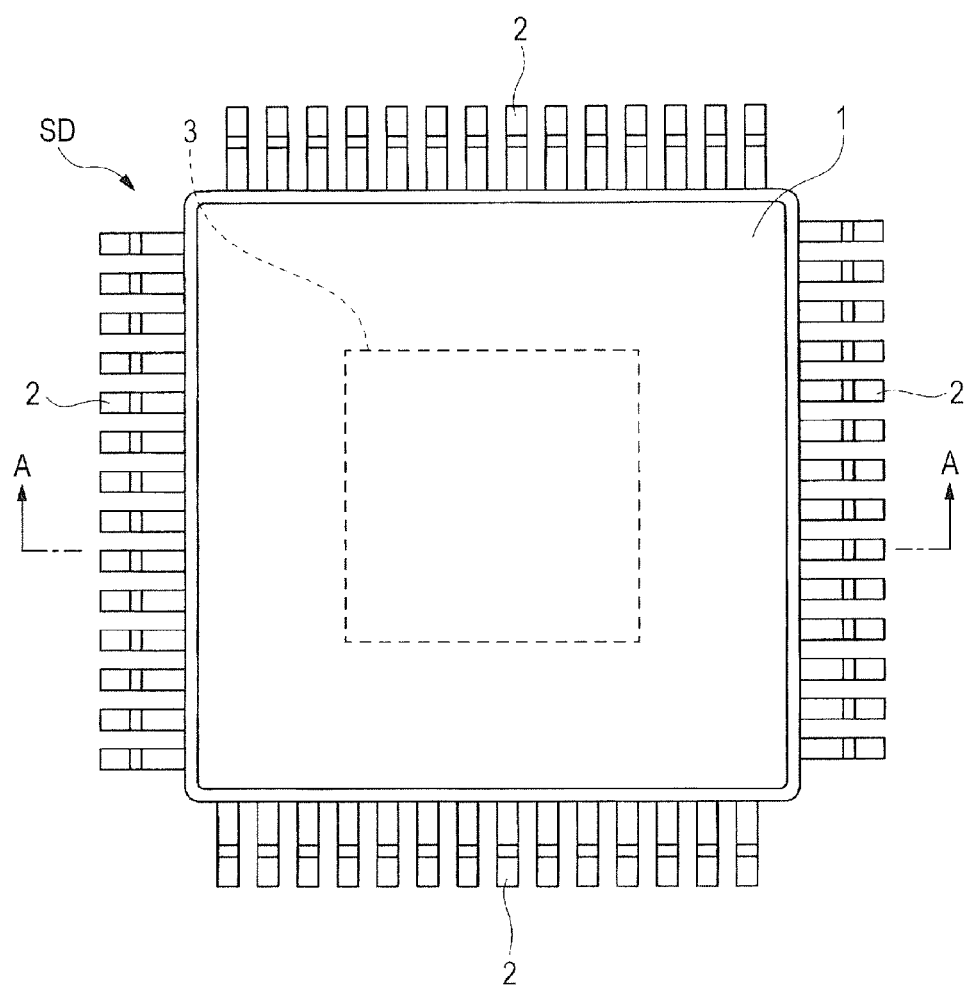
FIG. 1 is a plan view of a semiconductor device of an embodiment.

First, a configuration of a semiconductor device SD of the present embodiment will be described with reference to FIGS. 1 and 2. FIG. 1 is a plan view of the semiconductor device of the present embodiment.

As shown in FIG. 1, the semiconductor device SD of the present embodiment has a sealing body 1 having a substantially rectangular shape and a plurality of leads 2. The sealing body has four sides, and on each side, a plurality of leads 2 protrude from the sealing body 1 so as to extend in a direction perpendicular to the side. A semiconductor chip 3 is arranged in a central portion of the sealing body 1. The semiconductor device SD is a QFP (Quad Flat Package) type semiconductor device.

Figure 2:
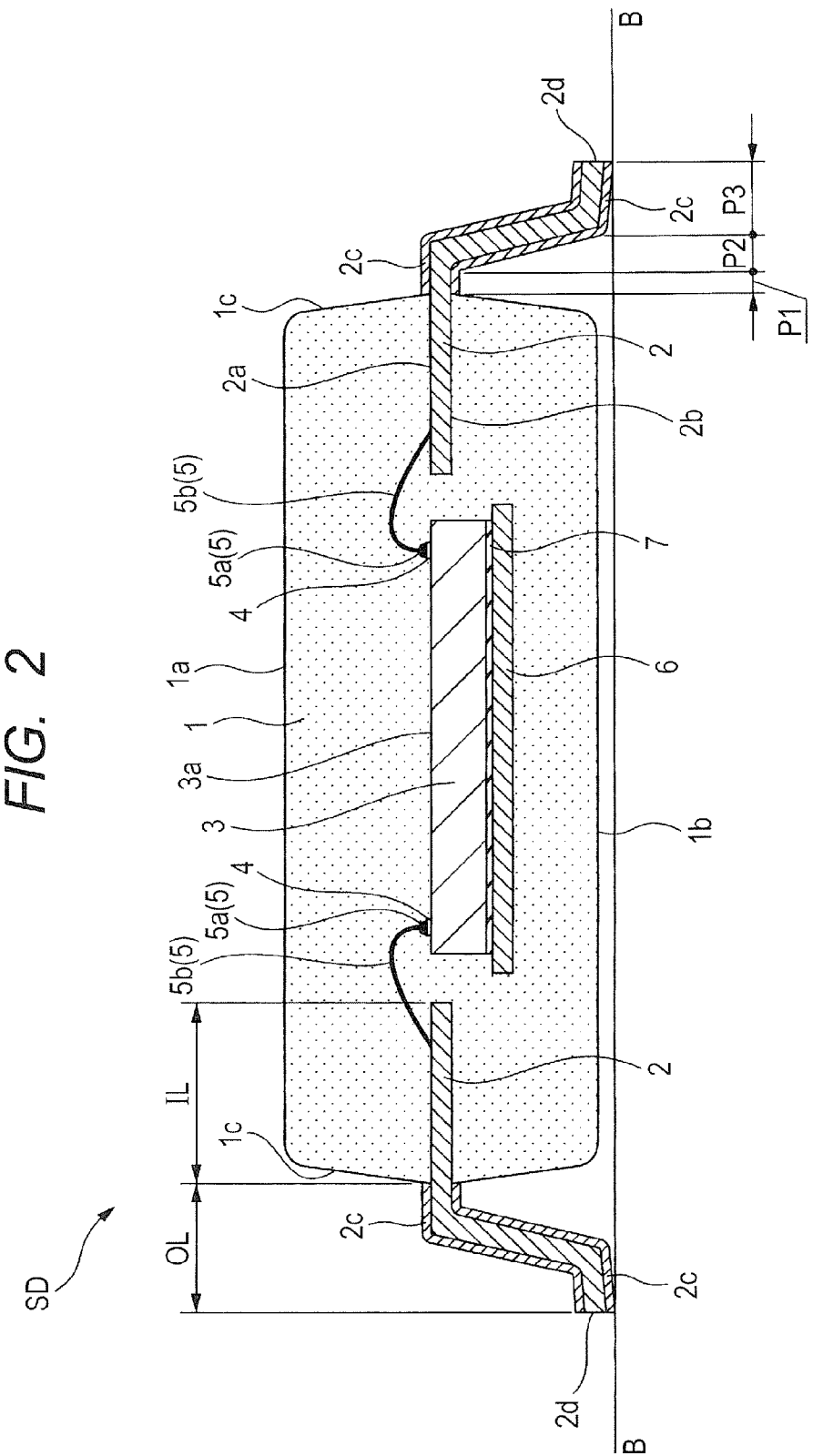
FIG. 2 is a cross-sectional view taken along line A-A in FIG. 1.

FIG. 2 is a cross-sectional view taken along line A-A in FIG. 1. In FIG. 2, the straight line B-B represents a mounting surface MB of a mounting substrate where the semiconductor device SD is mounted. The semiconductor device SD has the semiconductor chip 3, the plurality of leads 2, and the sealing body 1.

The semiconductor chip 3 is formed of a semiconductor substrate made of, for example, silicon (Si), and has a plurality of semiconductor elements, a plurality of wirings, and a plurality of pad electrodes (terminals, external electrodes, external extraction electrodes, or electrode pads) 4. The semiconductor element is, for example, MISFET (Metal Insulator Semiconductor Field Effect Transistor), and the wiring and the pad electrode 4 are made of, for example, a metal film composed mainly of copper (Cu). A plurality of semiconductor elements and a plurality of pad electrodes 4 are formed in a main surface 3a of the semiconductor chip 3. The plurality of semiconductor elements are coupled together by a plurality of wirings (metal wirings) and form a circuit block. The semiconductor elements that form a circuit block are electrically coupled with the pad electrodes 4 through wirings. The plurality of pad electrodes 4 are electrically coupled with a plurality of leads 2. The pad electrode 4 is coupled to the lead 2 mainly composed of, for example, copper (Cu) by a wire (bonding wire) 5 mainly composed of, for example, copper (Cu). As shown in FIG. 2, the wire 5 has a wire portion 5b and a wire portion 5b. The ball portion 5a is formed at one end of the wire portion 5b, the ball portion 5a is coupled to the pad electrode 4, and the other end of the wire portion 5b is coupled to the lead 2.

Here, "made of copper (Cu)" means a metal composed mainly of copper (Cu). A metal film, a lead, and a wire that are composed mainly of copper (Cu) include a copper alloy containing a small amount (1% or less) of metallic additive. Here, examples of the metallic additive include one or more kinds of metals selected from aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), nickel (Ni), platinum (Pt), lanthanoid-based metal, actinoid-based metal, and the like. When a metal film, a lead, or a wire composed mainly of copper (Cu) is stored (left) in the atmosphere, copper oxide is mainly formed on a surface thereof because the amount of metallic additive is small.

For example, the sealing body 1 made of epoxy resin covers the semiconductor chip 3, the wire 5, the lead 2, a die pad (a chip mounting portion) 6, and a bonding layer 7. The semiconductor chip 3 is bonded to the die pad 6 by the bonding layer 7. The sealing body 1 includes a flat main surface (a sealing body main surface) 1a, a flat back surface (a sealing body back surface) 1b, and a side surface (a sealing body side surface) 1c that couples between the main surface 1a and the back surface 1b. The main surface (upper surface or front surface) 1a and the back surface (lower surface) 1b are in parallel with the mounting surface MB in a state which the semiconductor device SD is mounted on the mounting substrate. In the state which the semiconductor device SD is mounted on the mounting substrate, a surface close to the mounting surface MB is defined as the sealing body back surface (lower surface) 1b and a surface far from the mounting surface MB is defined as the sealing body main surface (upper surface or front surface) 1a.

A plurality of leads 2 are arranged so as to surround the semiconductor chip 3 and radially extend in a radial fashion from the semiconductor chip 3. A plurality of leads 2 are formed of copper (Cu) which is a base material. Each lead 2 has a main surface (upper surface, front surface, or lead main surface) 2a and a back surface (lower surface or lead back surface) 2b. The lead 2 is made of an inner lead portion IL located inside the sealing body 1 and an outer lead OL. The main surface 2a and the back surface 2b of the outer lead portion OL are covered by a solder plating film 2c. Side surfaces of the lead 2 of the outer lead portion OL are also covered by the solder plating film 2c. However, a tip 2d of the outer lead portion OL is not covered by the solder plating film 2c and there is a portion where the base material is exposed. However, the circumference of the base material of the tip 2d is covered by the solder plating film 2c. The wire 5 is coupled to the main surface 2a of the inner lead portion IL of the lead 2.

The outer lead portion OL has a gull-wing shape and includes a protrusion portion P1 that continues from the inner lead portion IL and lineally protrudes to the outside of the sealing body 1, a bent portion P2 that extends from the protrusion portion P1 to the mounting surface MB, and a coupling portion P3 that extends from the bent portion P2 in substantially parallel with the mounting surface MB and is coupled to the mounting surface through a mounting solder.

While the protrusion portion P1, the bent portion P2, and the coupling portion P3 are defined by using the side of the back surface 2b of the lead 2 in FIG. 2, the same goes for the side of the main surface 2a. Over the back surface 2b of the lead 2, the outer lead portion OL includes the protrusion portion P1, the bent portion P2, and the coupling portion P3.

<Method of Manufacturing Semiconductor Device>

Figure 3:
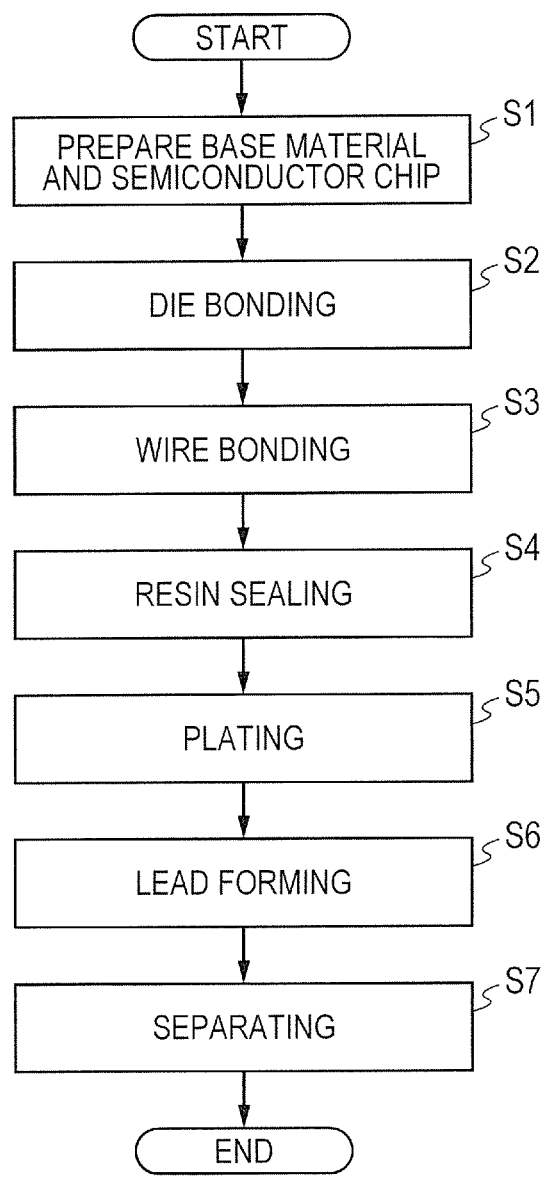
FIG. 3 is a process flow diagram of the semiconductor device of the embodiment.

A method of manufacturing the semiconductor device SD of the present embodiment will be described with reference to FIG. 3. FIG. 3 is a process flow diagram of the semiconductor device SD. FIG. 4 is a cross-sectional view of the semiconductor device of the present embodiment which is in a manufacturing process. FIG. 4 shows cross-sectional views of one semiconductor device forming region.

Figure 4A:
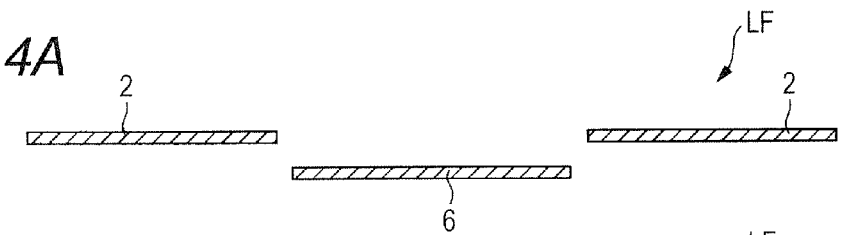
FIGS. 4A to 4E are cross-sectional views of the semiconductor device of the embodiment which is in a manufacturing process.

First, as shown in FIG. 4A, a "prepare base material and semiconductor chip" process (step S1) in the process flow diagram in FIG. 3 is performed. A lead frame LF composed mainly of copper (Cu) is prepared as a base material. As shown in FIG. 4A, a plurality of leads 2 and the die pad 6 are formed in one semiconductor device forming region of the lead frame LF. Although not shown in the drawings, in the lead frame LF, a plurality of semiconductor device forming regions are arranged in a matrix form in plan view.

Next, the semiconductor chip 3 is prepared. As described above, a plurality of MISFETs and a plurality of pad electrodes 4 are formed on the main surface 3a of the semiconductor chip 3. Although not shown in the drawings, in the main surface 3a of the semiconductor chip 3, the plurality of pad electrodes 4 are circularly arranged along the outer circumference of the main surface 3a. Either of the preparation process of the base material and the preparation process of the semiconductor chip 3 may be performed first.

Figure 4B:
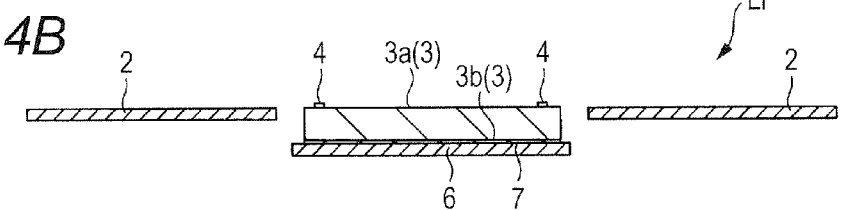

Next, as shown in FIG. 4B, a "die bonding" process (step S2) in the process flow diagram in FIG. 3 is performed. A back surface 3b of the semiconductor chip 3 is bonded and fixed over the die pad 6 of the lead frame LF through a bonding layer 7. As the bonding layer 7, for example, an epoxy-based bonding material or a conductive bonding material where metal particles made of silver (Ag) and the like are contained in an epoxy-based thermosetting resin are used.

Figure 4C:
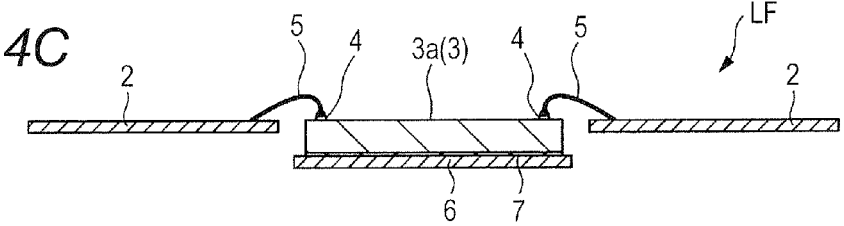

Next, as shown in FIG. 4C, a "wire bonding" process (step S3) in the process flow diagram in FIG. 3 is performed. The pad electrode 4 provided on the main surface 3a of the semiconductor chip 3 and the lead 2 are electrically coupled together by the wire 5 composed mainly of copper (Cu). First, a first wire bonding process that couples one end of the wire 5 to the pad electrode 4 is performed, and thereafter a second wire bonding process that couples the other end of the wire 5 to the lead 2 is performed. Normally, a gold plating film or a palladium plating film is famed on the main surface 2a of the lead 2, in particular, on a coupling portion of the wire 5 in order to improve bonding property or coupling reliability of the wire 5 and the lead 2. However, no plating film is attached to the surface of the lead 2, and the wire 5 is coupled to the copper (Cu) that is the base material. The "wire bonding" process (step S3) will be described later in detail.

Figure 4D:
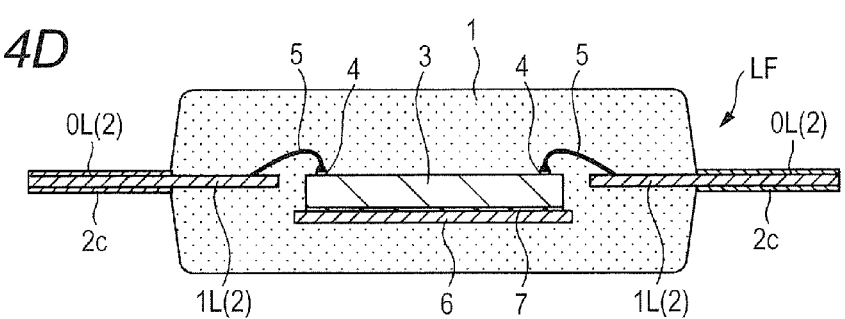

Next, as shown in FIG. 4d, a "resin sealing" process (step S4) and a "plating" process (step S5) in the process flow diagram in FIG. 3 are performed.

In the "resin sealing" process (step S4), the semiconductor chip 3, the wire 5, the lead 2, the die pad 6, and the bonding layer 7 are covered (sealed) by a sealing resin, and the sealing body 1 is formed. The sealing resin is made of an epoxy resin or the like that contains spherical silica ($SiO_2$) particles as fillers.

Next, in the "plating" process (step S5), the solder plating film 2c is famed on the outer lead portions OL of a plurality of leads 2 that are exposed from the sealing body. The solder plating film 2c is formed on the main surface 2a, the back surface 2b, and side surfaces of the lead 2 in the outer lead portion OL. The solder plating film 2c is formed of pure Sn, Sn—Bi based material, or Sn—Cu based material.

Figure 4E:
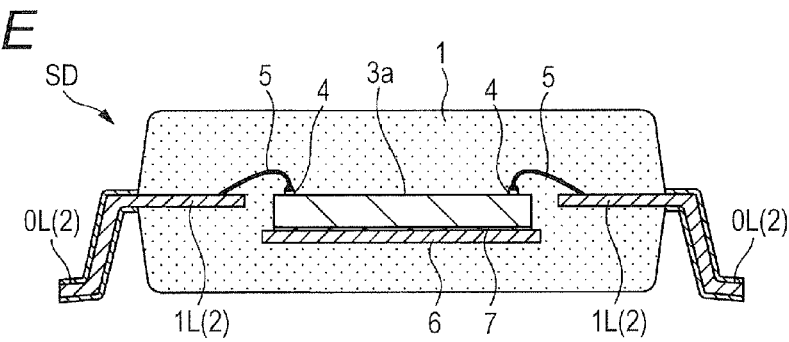

Next, as shown in FIG. 4E, a "lead forming" process (step S6) in the process flow diagram in FIG. 3 is performed.

After the solder plating film 2c is formed, the tips 2d of the plurality of leads 2 are separated from a frame body of the lead frame, and then the lead forming process (step S6) is performed. The outer lead portion OL of each lead 2 is formed into the gull-wing shape described above. Although not shown in the drawings, the die pad 6 is coupled to the frame body of the lead frame in the lead forming process.

Next, a "separating" process (step S7) in the process flow diagram in FIG. 3 is performed. Each semiconductor device forming region is cut off and separated from the lead frame. The semiconductor device forming region has the semiconductor chip 3 sealed by the sealing body 1, the die pad 6, and a plurality of leads 2. The semiconductor chip 3 is fixed over the die pad 6 through the bonding layer 7. A plurality of pad electrodes 4 provided on the main surface 3a of the semiconductor chip 3 and a plurality of leads 2 are electrically coupled together through a plurality of wires 5. As a result, the semiconductor device SD shown in FIGS. 1 and 2 are obtained.

Next, the "wire bonding" process (step S3) in the process flow diagram in FIG. 3 will be further described with reference to FIGS. 5 to 13.

Figure 5:
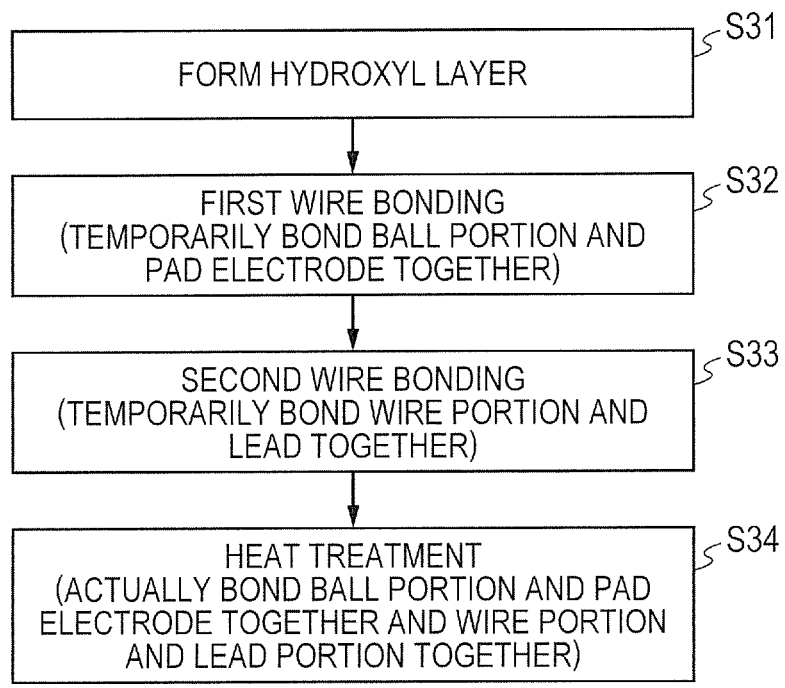
FIG. 5 is a process flow diagram showing details of a "wire bonding" process in FIG. 3.
Figure 8A:
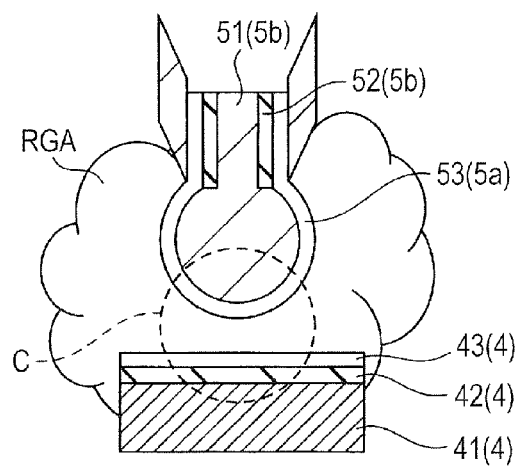
FIG. 8A is a cross-sectional view during the "wire bonding" process following FIG. 7.
Figure 8B:
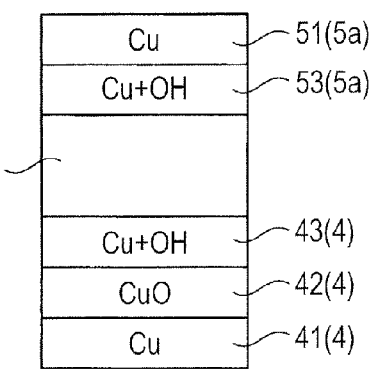
FIG. 8B is an enlarged cross-sectional view of a portion C in FIG. 8A.
Figure 8C:
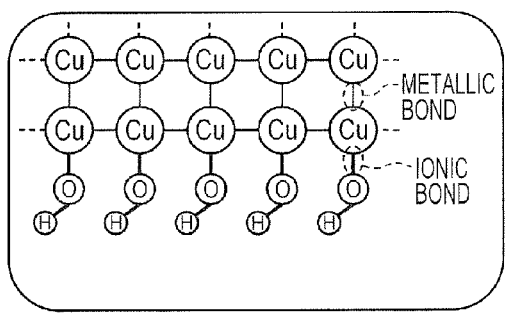
Figure 8D:
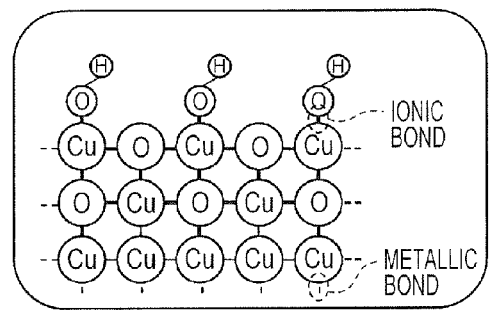
FIG. 8D is an atomic-level state diagram of a surface of a pad electrode 4.
Figure 9A:
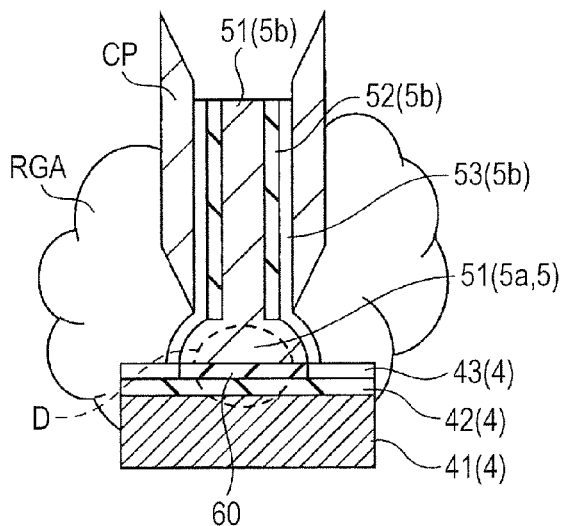
Figure 9B:
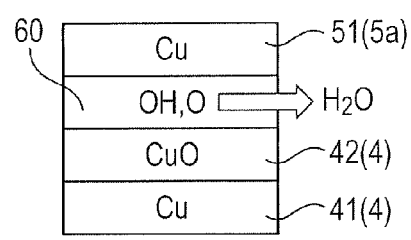
FIG. 9B is an enlarged cross-sectional view of a portion D in FIG. 9A.
Figure 9C:
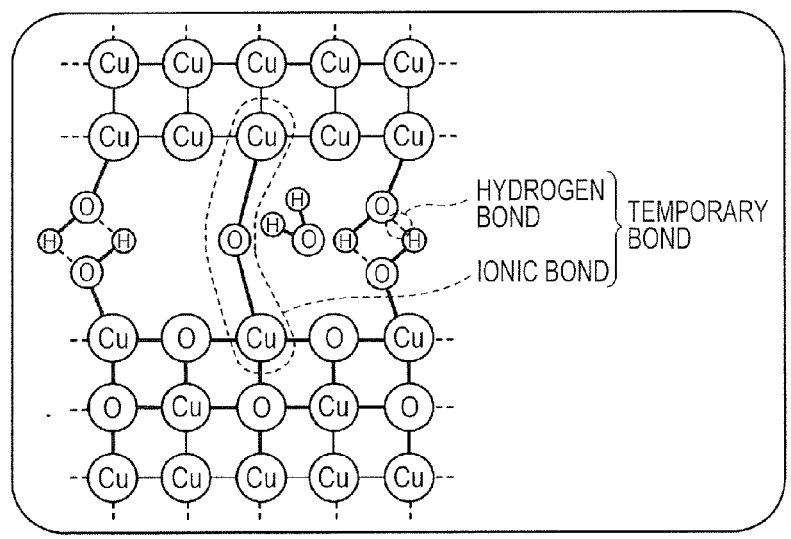
FIG. 9C is an atomic-level state diagram of an interface between the ball portion 5a and the pad electrode 4.
Figure 10A:
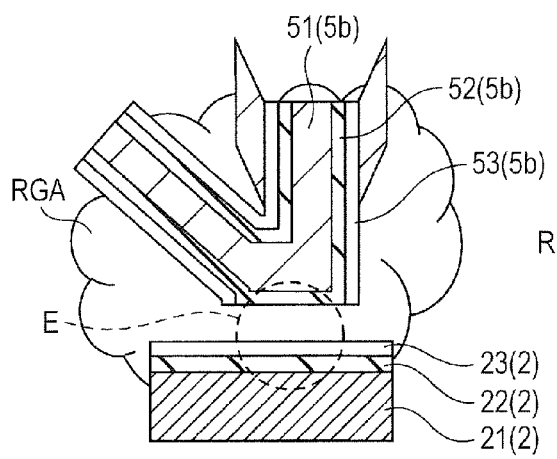
FIG. 10A is a cross-sectional view during the "wire bonding" process following FIG. 9A.
Figure 10B:
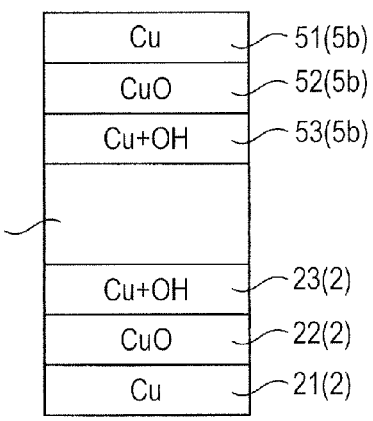
FIG. 10B is an enlarged cross-sectional view of a portion E in FIG. 10A.
Figure 10C:
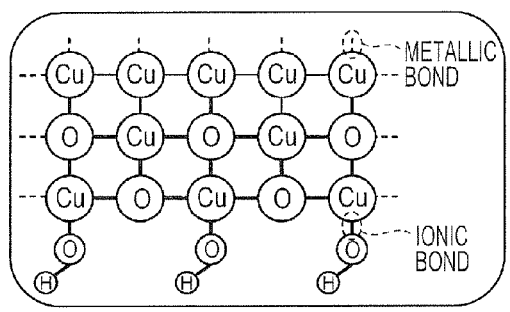
FIG. 10C is an atomic-level state diagram of a surface of a wire portion 5b.
Figure 10D:
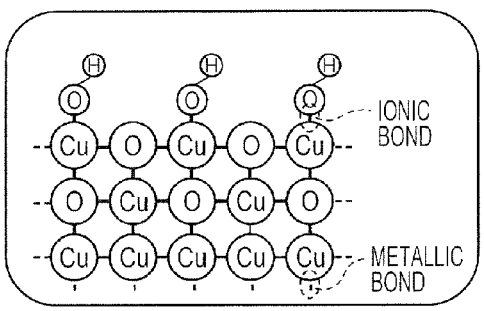
FIG. 10D is an atomic-level state diagram of a surface of a lead 2.
Figure 11A:
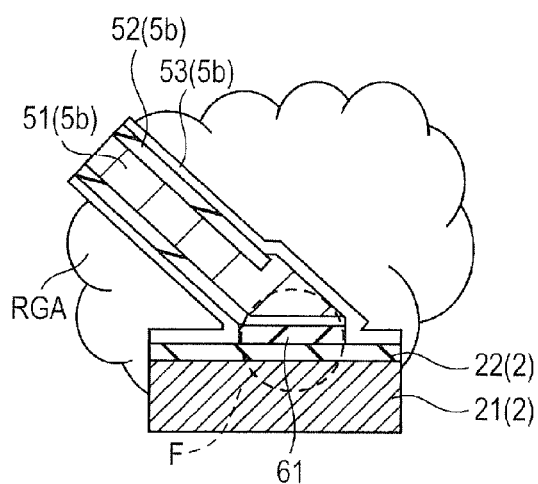
Figure 11B:
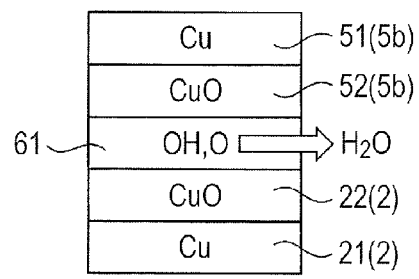
FIG. 11B is an enlarged cross-sectional view of a portion F in FIG. 11A.
Figure 11C:
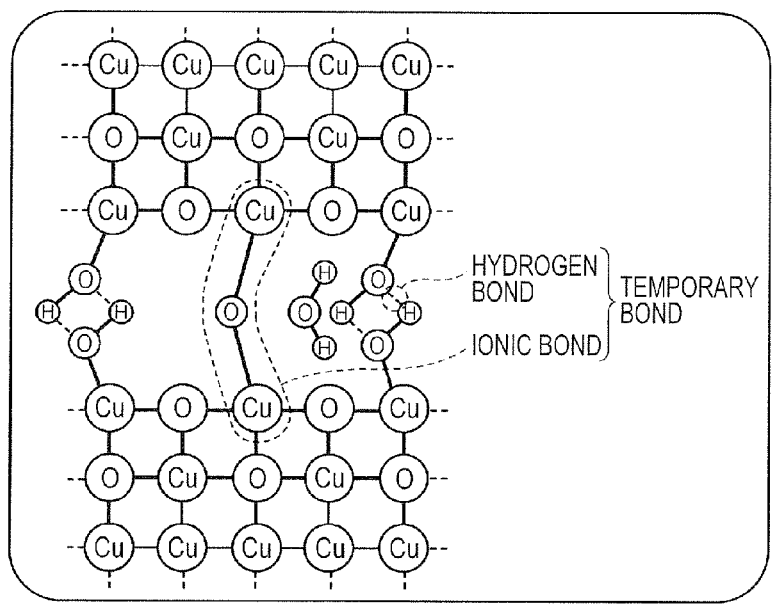
FIG. 11C is an atomic-level state diagram of an interface between the wire portion 5b and the lead 2.

FIG. 5 is a process flow diagram showing details of the "wire bonding" process in FIG. 3. FIGS. 6 to 13 are cross-sectional views during the "wire bonding" process. Here, FIG. 8A is a cross-sectional view showing a state immediately before a "first bonding" process shown in FIG. 5. FIG. 8B is an enlarged cross-sectional view of a portion C in FIG. 8A. FIG. 8C is an atomic-level state diagram of a surface of the ball portion 5a. FIG. 8D is an atomic-level state diagram of a surface of the pad electrode 4. FIG. 9A is a cross-sectional view showing the "first bonding" process shown in FIG. 5. FIG. 9B is an enlarged cross-sectional view of a portion D in FIG. 9A. FIG. 9C is an atomic-level state diagram of an interface between the ball portion 5a and the pad electrode 4. FIG. 10A is a cross-sectional view showing a state immediately before a "second bonding" process shown in FIG. 5. FIG. 10B is an enlarged cross-sectional view of a portion E in FIG. 10A. FIG. 10C is an atomic-level state diagram of a surface of the wire portion 5b. FIG. 10D is an atomic-level state diagram of a surface of the lead 2. FIG. 11A is a cross-sectional view showing the "second bonding" process shown in FIG. 5. FIG. 11B is an enlarged cross-sectional view of a portion F in FIG. 11A. FIG. 11C is an atomic-level state diagram of an interface between the wire portion 5b and the lead 2. FIG. 13A is a cross-sectional view of an interface between the ball portion 5a and the pad electrode 4 after a "heat treatment" process shown in FIG. 5. FIG. 13B is a cross-sectional view of an interface between the wire portion 5b and the lead 2 after the "heat treatment" process shown in FIG. 5. FIG. 13C is an enlarged cross-sectional view of a G portion in FIG. 13A or an H portion in FIG. 13B.

As shown in FIG. 5, the "wire bonding" process (step S3) in FIG. 3 includes a "form hydroxyl layer" process (step S31), a "first wire bonding" process (step S32), a "second wire bonding" process (step S33), and a "heat treatment" process (step S34). The "first wire bonding" process (step S32) is a process that temporarily bonds the ball portion 5a of the wire 5 and the pad electrode 4 together. The "second wire bonding" process (step S33) is a process that temporarily bonds the wire portion 5b of the wire 5 and the lead 2 together. Further, the "heat treatment" process (step S34) is a process that actually bonds the ball portion 5a of the wire 5 and the pad electrode 4 together and the wire portion 5b of the wire 5 and the lead 2 together.

Figure 6:
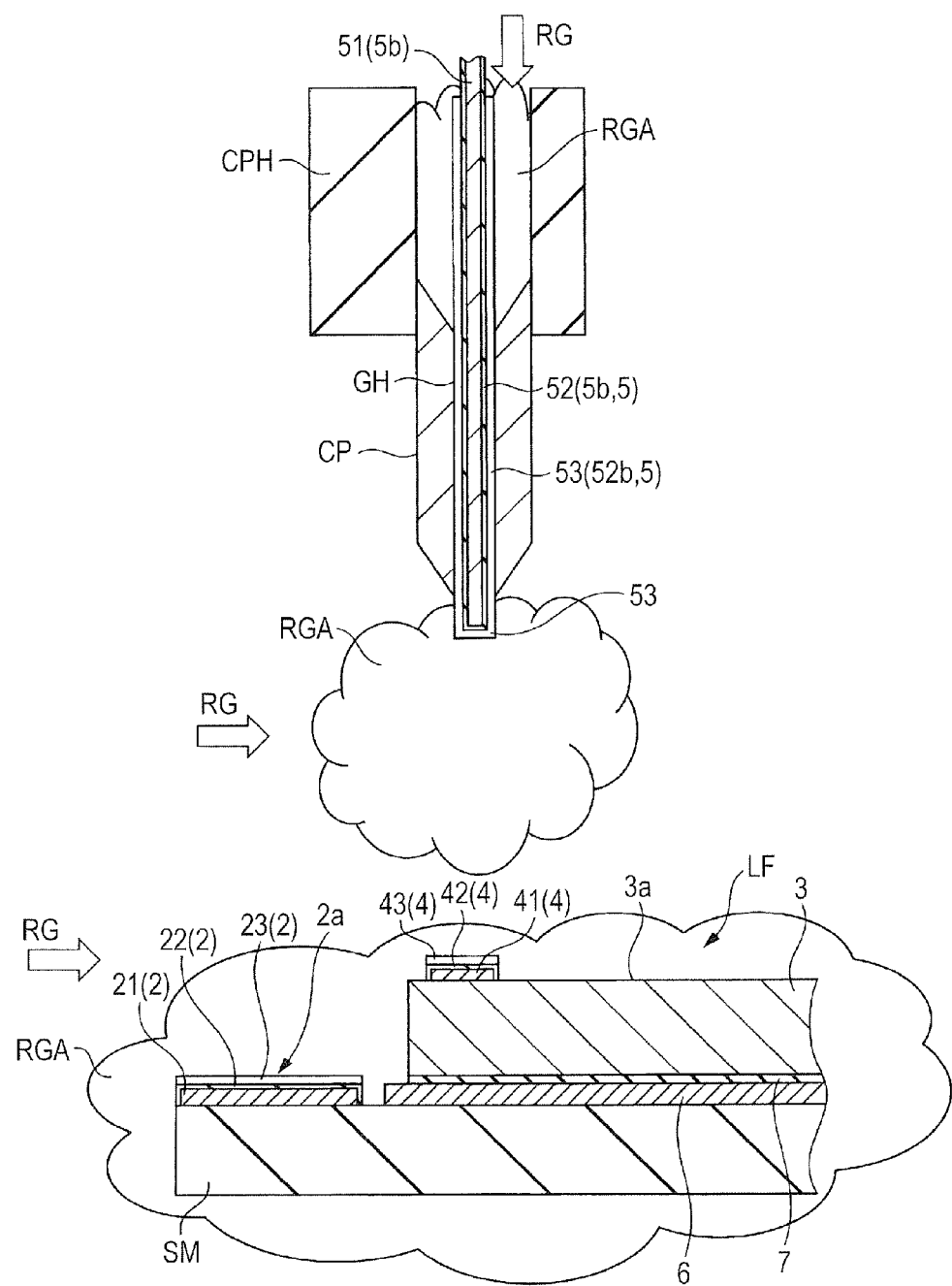
FIG. 6 is a cross-sectional view during a "wire bonding" process.
Figure 7:
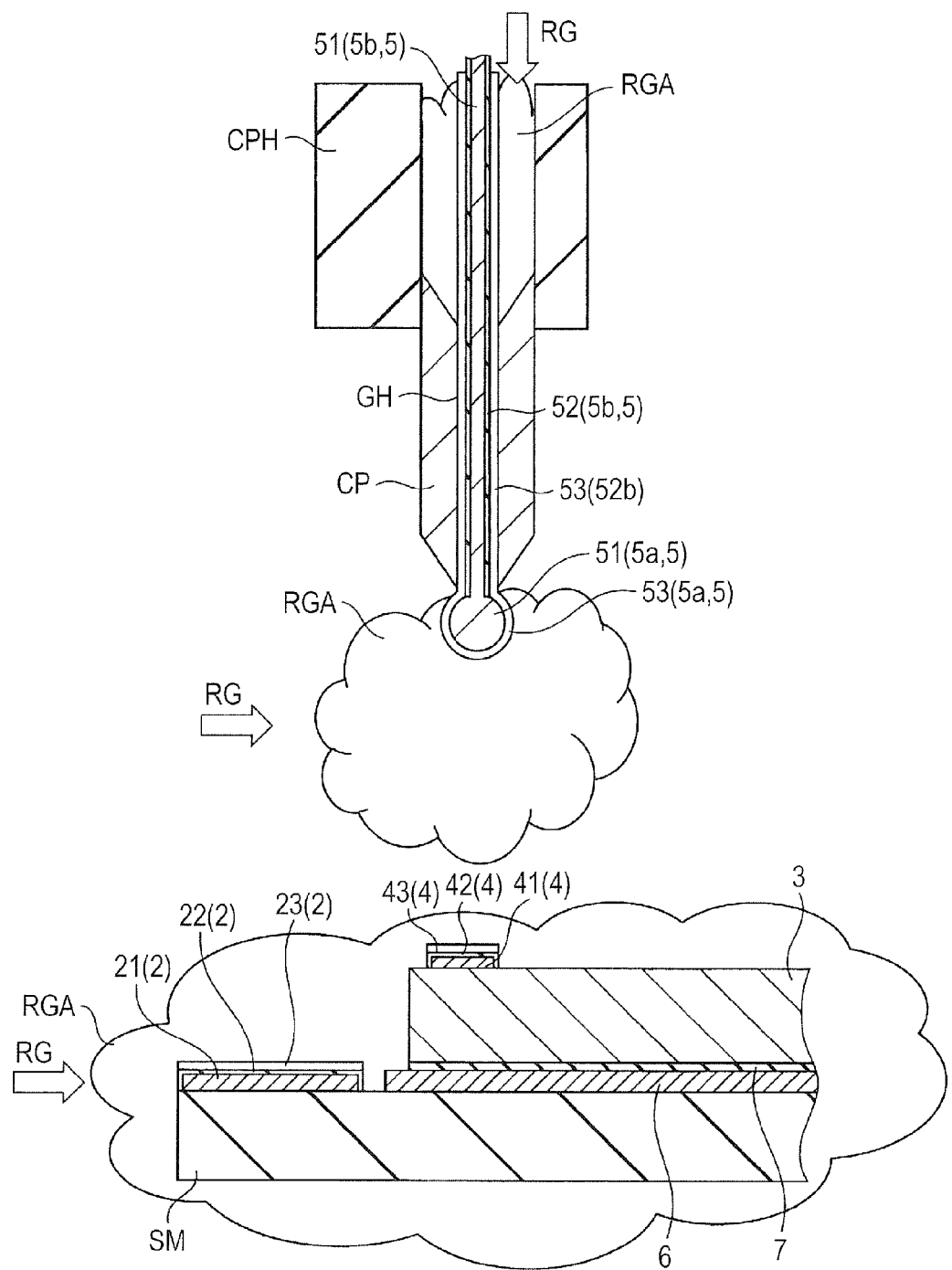
FIG. 7 is a cross-sectional view during the "wire bonding" process following FIG. 6.

As shown in FIGS. 6 and 7, the "form hydroxyl layer" process (step S31) in FIG. 5 is performed.

As shown in FIG. 6, the lead frame FL is mounted over a supporting body (supporting tool) SM. FIG. 6 shows the lead 2, the die pad 6, the semiconductor chip 3 mounted over the die pad 6 through the bonding layer 7, and the pad electrode 4 formed on the main surface 3a of the semiconductor chip 3, which are provided to the semiconductor device forming region of the lead frame LF. The lead 2 and the semiconductor chip 3 are exposed to a reducing gas atmosphere PGA. The reducing gas atmosphere PGA is formed by, for example, supplying a reducing gas RG so that the reducing gas RG covers the main surface 3a of the semiconductor chip 3 and the main surface 2a of the lead 2. The supply of the reducing gas RG is started immediately after the lead frame LF is mounted over the supporting body SM. In other words, the lead 2 and the semiconductor chip 3 are exposed to the reducing gas atmosphere PGA before formation of the ball portion 5a described later. The reducing gas RG is, for example, a mixed gas of nitrogen ($N_2$) and hydrogen ($H_2$) (for example, 95% $N_2$+5% $H_2$). A flow rate of the reducing gas RG is about 1 litter/minute.

Before the "wire bonding" process (step S3) shown in FIG. 3, the semiconductor chip 3 and the lead 2 are stored in the atmosphere, so that oxidized layers 22 and 42 made of a natural oxide film (CuO) are formed on the surfaces of the lead 2 made of copper and the pad electrode 4 made of copper. The oxidized layers 22 and 42 are formed on a surface of a core layer 21 of the lead 2 and a surface of a core layer 41 of the pad electrode 4, which are exposed to the atmosphere.

As shown in FIG. 6, the pad electrode 4 and the lead 2 are exposed to the reducing gas atmosphere PGA before the wire 5 is coupled to the pad electrode 4 and the lead 2, and thereby hydroxyl layers 23 and 43 are formed on surfaces of the oxidized layers 22 and 42 of the lead 2 and the pad electrode 4, respectively.

Next, the wire 5 made of copper is passed through a guide hole GH of a capillary CP and the wire 5 is protruded from a tip of the capillary CP. The circumference of the capillary CP is held by a capillary supporting portion CPH. The inside of the capillary supporting portion CPH, the inside of the guide hole GH, and the tip portion of the capillary CP are exposed to the reducing gas atmosphere PGA. The supply of the reducing gas PG is started before the wire 5 is inserted into the guide hole GH of the capillary CP. In other words, the wire 5 is exposed to the reducing gas atmosphere PGA before formation of the ball portion 5a described later.

The wire 5 made of copper (Cu) is in contact with oxygen in the atmosphere, and thereby an oxidized layer 52 made of a natural oxide film (CuO) is formed on the surface of the wire 5 made of copper. The oxidized layer 52 is formed on a surface of a core layer 51 made of copper.

As described above, the inside of the capillary supporting portion CPH, the inside of the guide hole GH, and the tip portion of the capillary CP are exposed to the reducing gas atmosphere PGA, so that a hydroxyl layer 53 is formed on a surface of the oxidized layer 52 of the wire 5.

Next, as shown in FIG. 7, the ball portion 5a is formed at the wire 5 protruded from the tip of the capillary CP. The ball portion 5a is formed in the reducing gas atmosphere PGA at the tip of the capillary CP. A torch electrode not shown in the drawings is brought close to the tip of the wire 5 and a high voltage is applied between the tip of the wire 5 and the torch electrode, and thereby an atmospheric discharge occurs between the wire 5 and the torch electrode, the tip of the wire 5 is heated and melted, and a ball-shaped ball portion 5a is formed. The ball portion 5a includes the core layer 51 made of copper and the hydroxyl layer 53 that covers the surface of the core layer 51. The ball portion 5a is formed in the reducing gas atmosphere PGA, so that the surface of the ball portion 5a is covered by the hydroxyl layer 53. In general, the tip of the wire 5 melts, so that the oxidized layer 52 that covers the surface of the wire 5 does not remain at the ball portion 5a. However, the oxidized layer 52 may partially remain.

FIGS. 8A to 8D show a state immediately before the "first bonding" process (step S32) shown in FIG. 5. As shown in FIGS. 8A and 8B, the ball portion 5a includes the core layer 51 and the hydroxyl layer 53 that covers the surface of the core layer 51. The core layer 51 is made of copper. The hydroxyl layer 53 is a layer formed of copper and hydroxyl groups. In other words, as shown in FIG. 8B or 8C, the hydroxyl layer 53 including copper atoms and hydroxyl groups (—OH) having an ionic bond with copper atoms is formed on the surface of the core layer 51 made of copper atoms forming a metallic bond.

As shown in FIGS. 8A and 8B, the pad electrode 4 includes a core layer 41 made of copper, an oxidized layer 42 that covers a surface of the core layer 41, and a hydroxyl layer 43 that covers a surface of the oxidized layer 42. The core layer 41 is made of copper. The oxidized layer 42 is made of a natural oxide film (CuO). The hydroxyl layer 43 is a layer formed of copper and hydroxyl groups. In other words, as shown in FIG. 8B or 8D, the oxidized layer 42 including copper atoms and oxygen (O) atoms having an ionic bond with copper atoms is formed on the surface of the core layer 41 made of copper atoms forming a metallic bond, and the hydroxyl layer 43 including hydroxyl groups (—OH) having an ionic bond with copper atoms included in the oxidized layer 42 is formed on the surface of the oxidized layer 42.

As shown in FIGS. 9A to 9C, the "first wire bonding" process (step S32) in FIG. 5 is performed. The "first wire bonding" process that bonds the ball portion 5a of the wire 5 to the pad electrode 4 is performed by applying a weight of 5 to 30 g weight and ultrasonic energy (for example, 120 KHz, amplitude: 0.1 μm) to the capillary CP and heating the pad electrode 4 to 130° C.-250° C. through the supporting body SM described above in the reducing gas atmosphere PGA. By the "first wire bonding" process, the ball portion 5a of the wire 5 is temporarily bonded to the pad electrode 4 (referred to as temporary bonding) by a temporary bonding layer 60 formed by hydrogen bond and ionic bond.

In the "first wire bonding" process, when the ball portion 5a is caused to come into contact with the pad electrode 4, the hydroxyl layer 53 of the ball portion 5a and the hydroxyl layer 43 of the pad electrode 4 hydrogen bond with each other. Then, a part of the hydrogen bond is dehydrated by the heating described above, so that an ionic bond including oxygen (O) atoms is formed between the ball portion 5a and the pad electrode 4. As a result, the ratio of the hydrogen bond gradually increases, and the ratio of the ionic bond gradually decreases. As shown in FIGS. 9B and 9C, the temporary bonding layer 60 includes the hydrogen bond and the ionic bond, and copper (Cu) atoms included in the ball portion 5a and copper (Cu) atoms included in the pad electrode 4 are bonded together by the hydrogen bond and the ionic bond (Cu—O—Cu).

After completing the "first wire bonding" process, the capillary CP is relatively moved to a position over the lead 2 and the "second wire bonding" process (step S33) in FIG. 5 is performed. First, a state immediately before the "second wire bonding" process (step S33) will be described. As shown in FIGS. 10A and 10B, the wire portion 5b includes the core layer 51, the oxidized layer 52 that covers the surface of the core layer 51, and the hydroxyl layer 53 that covers the surface of the oxidized layer 52. The core layer 51 is made of copper. The oxidized layer 52 is made of a natural oxide film (CuO). The hydroxyl layer 53 is a layer formed of copper and hydroxyl groups. In other words, as shown in FIG. 10B or 10C, the oxidized layer 42 including copper atoms and oxygen (O) atoms having an ionic bond with copper atoms is formed on the surface of the core layer 51 made of copper atoms forming a metallic bond, and the hydroxyl layer 53 including copper atoms and hydroxyl groups (—OH) having an ionic bond with copper atoms is formed on the surface of the oxidized layer 42.

The lead 2 includes the core layer 21, the oxidized layer 22 that covers the surface of the core layer 21, and the hydroxyl layer 23 that covers the surface of the oxidized layer 22. The core layer 21 is made of copper. The oxidized layer 22 is made of a natural oxide film (CuO). The hydroxyl layer 23 is a layer formed of copper and hydroxyl groups. In other words, as shown in FIG. 10B or 10D, the oxidized layer 22 including copper atoms and oxygen (O) atoms having an ionic bond with copper atoms is formed on the surface of the core layer 21 made of copper atoms forming a metallic bond, and the hydroxyl layer 23 including copper atoms and hydroxyl groups (—OH) having an ionic bond with copper atoms is formed on the surface of the oxidized layer 22.

As shown in FIGS. 11A to 11C, the "second wire bonding" process (step S33) in FIG. 5 is performed. In the "second wire bonding" process, in the reducing gas atmosphere PGA, the wire portion 5b is bonded to the lead 2, and then wire 5 is cut off. The lead 2 is also heated to 130° C.-250° C. through the supporting body SM described above. By the "second wire bonding" process, the wire portion 5b of the wire 5 is bonded to the lead 2 (referred to as temporary bonding) by a temporary bonding layer 61 formed by hydrogen bond and ionic bond.

In the "second wire bonding" process, when the ball portion 5b is caused to come into contact with the lead 2, the hydroxyl layer 53 of the wire portion 5b and the hydroxyl layer 23 of the lead 2 hydrogen bond with each other. Then, a part of the hydrogen bond is dehydrated by the heating described above, so that an ionic bond including oxygen (O) atoms is formed between the wire portion 5b and the lead 2. As a result, the ratio of the hydrogen bond gradually increases, and the ratio of the ionic bond gradually decreases. As shown in FIGS. 11B and 11C, the temporary bonding layer 61 includes the hydrogen bond and the ionic bond, and copper (Cu) atoms included in the wire portion 5b and copper (Cu) atoms included in the lead 2 (to be exact, oxidized layer 22) are bonded together by the hydrogen bond and the ionic bond (Cu—O—Cu).

The "first wire bonding" process (step S32) and the "second wire bonding" process (step S33) described above are repeated a plurality of times, and a plurality of pad electrodes 4 famed on the main surface 3a of the semiconductor chip 3 are coupled with a corresponding plurality of leads 2 by the wires 5. Then, the wire bonding process for one semiconductor chip 3 (step S3 in FIG. 3) is completed. A plurality of semiconductor device forming regions are provided and a plurality of semiconductor chips 3 are mounted in one lead frame LF, so that the wire bonding process is repeatedly performed on the plurality of semiconductor chips 3. Further, a plurality of lead frames LF are prepared by repeatedly performing the same operation as described above.

Figure 12:
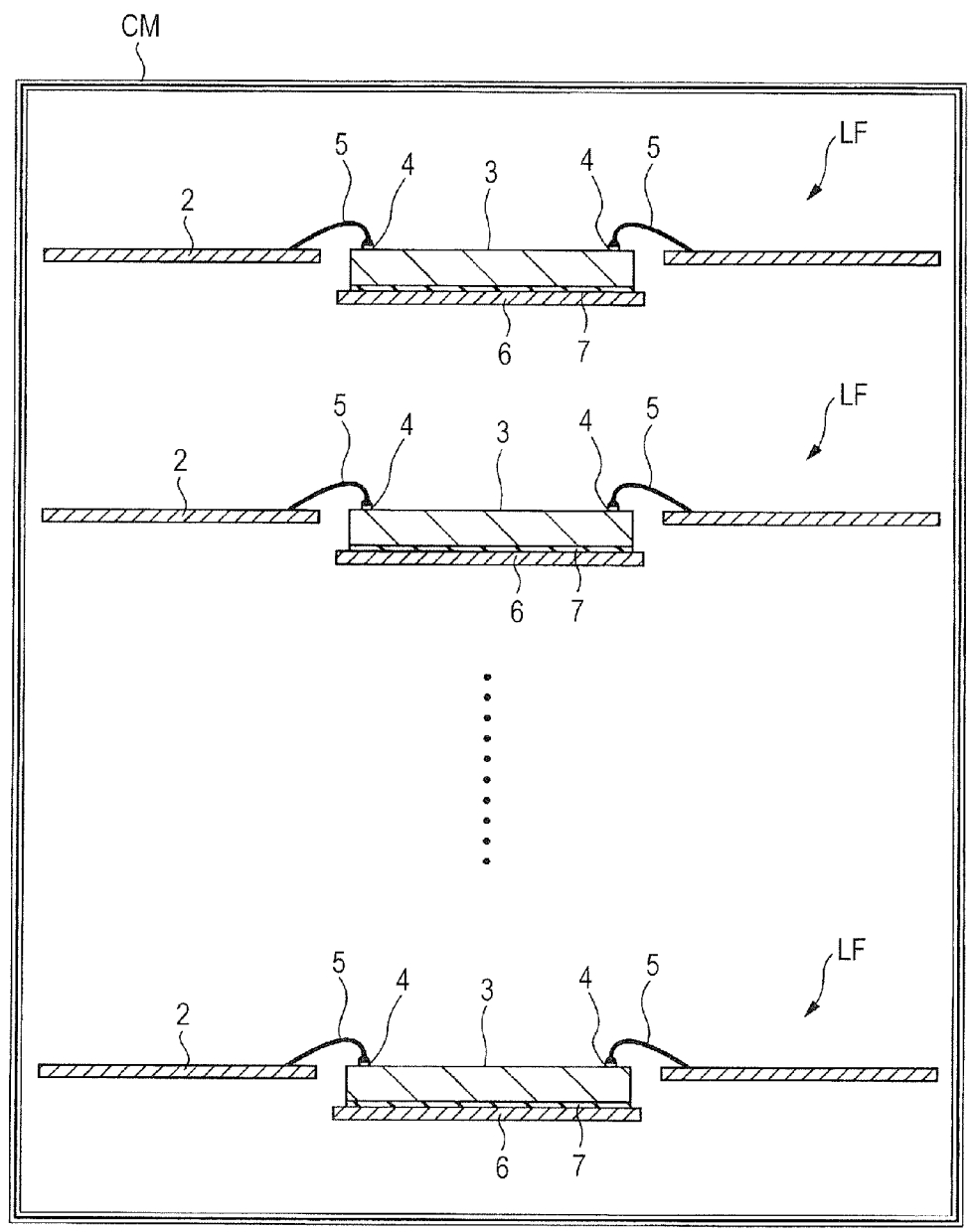
FIG. 12 is a cross-sectional view of the semiconductor device of the embodiment which is in a manufacturing process.
Figure 13A:
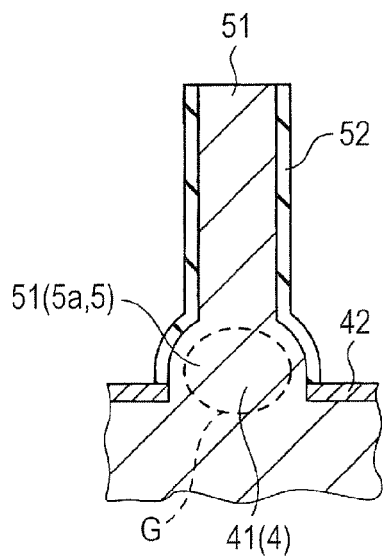
FIG. 13A is a cross-sectional view of an interface between the ball portion 5a and the pad electrode 4 after a "heat treatment" process shown in FIG. 5.
Figure 13B:
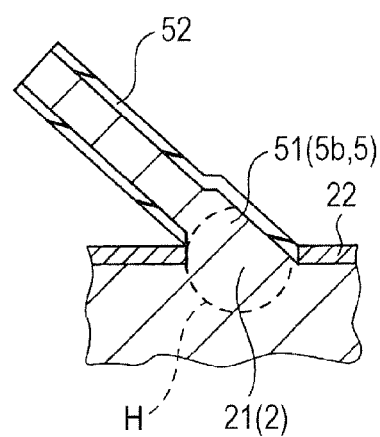
FIG. 13B is a cross-sectional view of an interface between the wire portion 5b and the lead 2 after the "heat treatment" process shown in FIG. 5.
Figure 13C:
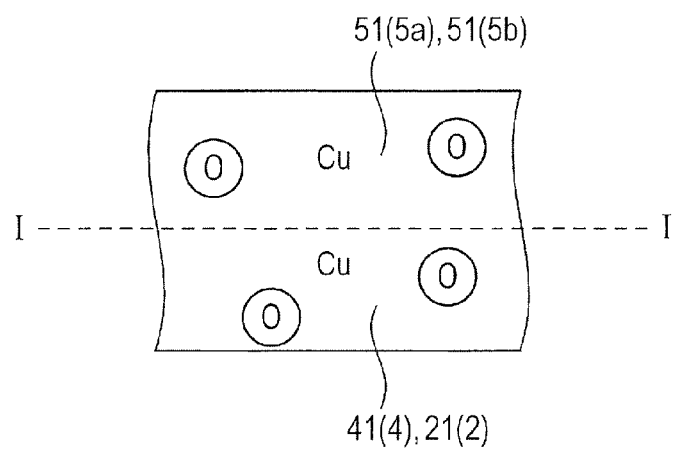
FIG. 13C is an enlarged cross-sectional view of a G portion in FIG. 13A or an H portion in FIG. 13B.

Next, as shown in FIG. 12, the "heat treatment" process (step S34) in FIG. 5 is performed. A plurality of lead frames LF are arranged in a chamber CM, and a heat treatment is performed on the pad electrodes 4 of the semiconductor chips 3, the wires 5, and the leads 2. It is important to make an atmosphere that does not oxidize the pad electrodes 4, the wires 5, and the leads 2 in the chamber CM. For example, the atmosphere is an inert gas atmosphere such as nitrogen ($N_2$) or argon (Ar), or a low-vacuum state of 100 Pa or higher. The heat treatment condition is, for example, from 200° C.×12 hours to 300° C.×10 hours. The heat treatment takes a long time, so that it is effective to perform the heat treatment on a plurality of lead frames LF at the same time. However, the heat treatment may be performed on one lead frame LF or one semiconductor chip 3.

FIG. 13A is a cross-sectional view of an interface between the ball portion 5a and the pad electrode 4 after the "heat treatment" process (step S34) shown in FIG. 5. FIG. 13B is a cross-sectional view of an interface between the wire portion 5b and the lead 2 after the "heat treatment" process (step S34) shown in FIG. 5. FIG. 13C is an enlarged cross-sectional view of a G portion in FIG. 13A and an H portion in FIG. 13B. In FIG. 13C, the interface between the ball portion 5a and the pad electrode 4 and the interface between the wire portion 5b and the lead 2 are indicated by the line I-I.

By performing the "heat treatment" process (step S34) shown in FIG. 5, the temporary bonding layer 60 located in a boundary between the ball portion 5a and the pad electrode 4 and the temporary bonding layer 61 located in a boundary between the wire portion 5b and the lead 2 disappear, and a metallic bond of copper atoms is formed (referred to as actual bond) in the boundary between the ball portion 5a and the pad electrode 4 and the boundary between the wire portion 5b and the lead 2. This is because dehydration in the hydrogen bonds further progresses by the heat treatment and the number of ionic bonds increases, and further the oxygen (O) atoms that have formed the ionic bands diffuse into the core layer 51 of the wire 5, the core layer 41 of the pad electrode 4, and the core layer 21 of the lead 2. Further, by the heat treatment, the oxygen atoms in the oxidized layer 42 in FIG. 9B and the oxidized layers 52 and 22 in FIG. 11B diffuse to the inside of the core layer 41 of the pad electrode 4, the inside of the core layer 51 of the wire 4, and the inside of the core layer 21 of lead 2, respectively, so that the oxidized layers 42, 52, and 22 disappear.

A dissociation energy between a copper atom and an oxygen atom is smaller than, for example, a dissociation energy between an aluminum (Al) atom and an oxygen atom (0) by about 30 to 40%, and further a diffusion speed of oxygen atoms in copper is fast, so that it is possible to form a bonded interface made of metallic bonds.

<Main Features and Effects of Method of Manufacturing Semiconductor Device of Present Embodiment>

It is possible to bond the wire 5 made of copper (Cu) and the pad electrode 4 made of copper (Cu) by metallic bond of copper (Cu) to copper (Cu). By this configuration, it is possible to increase the bond strength of the bonded interface and improve the reliability of the semiconductor device. Further, it is possible to reduce electrical characteristics (for example, contact resistance) of the bonded interface. Further, it is possible to improve thermal conductivity of the bonded interface.

For example, when a wire made of copper is coupled to a pad electrode made of aluminum, there is concern over corrosion due to a battery effect caused by dissimilar metallic bond. However, in the present embodiment, similar metals are bonded together, so that there is no concern over such corrosion.

The wire 5 made of copper (Cu) is directly coupled to the surface of the lead 2 made of copper (Cu) (the second wire bonding), so that it is not necessary to previously provide gold (Au) plating on the surface of the lead 2 to improve coupling reliability and it is possible to reduce the cost of lead frame LF. Further, it is not necessary to apply palladium plating for preventing oxidization to the surface of the wire 5 made of copper (Cu), so that it is also possible to reduce the cost of wire 5.

While the invention made by the inventors has been specifically described based on the embodiment, it is needless to say that the present invention is not limited to the embodiment and may be variously modified without departing from the scope of the invention. A plurality of modified examples will be described below. However, it is possible to appropriately combine and implement the modified examples.

For example, it is preferable to perform argon (Ar) plasma processing on the surface of the pad electrode 4 and the surface of the lead 2 between the "die bonding" process (step S2) and the "wire bonding" process (step S3) in FIG. 3.

An organic film is removed by performing the argon (Ar) plasma processing on the surface of the lead 2, so that it is possible to improve bonding property between the wire 5 and the lead 2 in the "second wire bonding" process. The organic film is, for example, an organic solvent that is evaporated from the bonding layer 7 when the bonding layer 7 is heat treated in the "die bonding" process (step S2) in FIG. 3.

It is possible to reduce the amount of reducing gas RG supplied to the surface of the pad electrode 4 in the "wire bonding" process (step S3) by performing the argon plasma processing on the surface of the pad electrode 4, so that it is possible to reduce the manufacturing cost. This is because copper (Cu) atoms in the surface of the pad electrode 4 are activated by the argon (Ar) plasma processing and react with moisture in the atmosphere, and thereby hydroxyl groups (—OH) are formed in the surface of the pad electrode 4.

While the QFP type semiconductor device is described as an example in the above embodiment, the embodiment can also be applied to a SOP (Small Outline Package) type semiconductor device, a QFN (Quad Flat Non lead package) type semiconductor device, and a BGA (Ball Grid Array) type semiconductor device.

In the QFP type semiconductor device, the leads 2 protrude from the four sides of the sealing body 1 as shown in FIG. 1. In the case of SOP type semiconductor device, leads protrude from two sides facing each other of a rectangular sealing body in plan view, which is different from the QFP type semiconductor device. However, the "wire bonding" process is the same as that in the embodiment.

In the QFP type semiconductor device, the leads 2 protrude from the side surface 1c of the sealing body 1 to the outside of the sealing body 1 as shown in FIG. 2. In the case of QFN type semiconductor device, leads protrude to a back surface of a sealing body, which is different from the QFP type semiconductor device. However, the "wire bonding" process is the same as that in the embodiment.

In the embodiment described above, the QFP type semiconductor device has a structure where the back surface of the die pad 6 is covered by the sealing body 1. However, the QFP type semiconductor device may have a structure where all or part of the back surface of the die pad 6 is exposed from the back surface 1b of the sealing body 1 (die pad exposed type structure). The SOP type semiconductor device or the QFN type semiconductor device may have the die pad exposed type structure.

In the case of BGA type semiconductor device, the base material of the above embodiment is a wiring substrate. The semiconductor chip is mounted over the wiring substrate through a bonding layer. A plurality of pad electrodes made of copper (Cu) are formed in the semiconductor chip. Further, a plurality of wiring layers made of copper (Cu) are formed in a surface of the wiring substrate, and the wiring layer corresponds to the lead of the embodiment described above. Therefore, a wire made of copper (Cu) is coupled to the pad electrode in the "first wire bonding" process, and the wire made of copper (Cu) is coupled to the wiring layer in the "second wire bonding" process. The "wire bonding" process is the same as that in the embodiment described above.

What is claimed is:
1. A method of manufacturing a semiconductor device, the method comprising the steps of:
   (a) preparing a semiconductor chip having a pad electrode made of first copper, on a main surface of the semiconductor chip;
   (b) preparing a base material having a chip mounting portion and a lead;
   (c) after the step (b), mounting the semiconductor chip in the chip mounting portion; and
   (d) after the step (c), coupling the pad electrode and the lead by using a wire which is made of second copper and has a ball portion and a wire portion,
   wherein the step (d) includes the steps of
   (d-1) exposing the wire and the pad electrode to a reducing gas atmosphere, forming a first hydroxyl layer on a surface of the ball portion, and forming a second hydroxyl layer on a surface of the pad electrode,
   (d-2) a first bonding step of joining the ball portion to the pad electrode through the first hydroxyl layer and the second hydroxyl layer, and
   (d-3) after the first bonding step, joining the ball portion to the pad electrode by performing a heat treatment on the semiconductor chip and the base material.

2. The method of manufacturing a semiconductor device according to claim 1,
   wherein the reducing gas atmosphere contains nitrogen and hydrogen.

3. The method of manufacturing a semiconductor device according to claim 1,
   wherein the second hydroxyl layer is formed on a surface of an oxidized layer formed on a surface of the pad electrode.

4. The method of manufacturing a semiconductor device according to claim 3,
   wherein after the step (d-2), a first bonding layer formed by first hydrogen bond and first ionic bond is formed between the ball portion and the pad electrode.

5. The method of manufacturing a semiconductor device according to claim 4,
   wherein the step (d-2) is performed in 130° C.-250° C.

6. The method of manufacturing a semiconductor device according to claim 4,
wherein the first ionic bond included in the first bonding layer is formed of a first copper atom of the first copper, an oxygen atom of the oxidized layer, and a second copper atom of the second copper.

7. The method of manufacturing a semiconductor device according to claim 6,
wherein after the step (d-3), a first metallic bond layer made of the first copper atoms and the second copper atoms is formed between the pad electrode and the ball portion.

8. The method of manufacturing a semiconductor device according to claim 1,
wherein the step (d-3) is performed in an inert gas atmosphere.

9. The method of manufacturing a semiconductor device according to claim 1,
wherein the step (d-3) is performed in a low-vacuum atmosphere of 10 Mpa or higher.

10. The method of manufacturing a semiconductor device according to claim 1,
wherein the step (d-1) further includes the steps of exposing the lead to the reducing gas atmosphere, forming a third hydroxyl layer on a surface of the wire portion, and forming a fourth hydroxyl layer on a surface of the lead, and
wherein the method further includes
(d-4) between the step (d-2) and the step (d-3), a second bonding step of bonding the wire portion to the lead through the third hydroxyl layer and the fourth hydroxyl layer.

11. The method of manufacturing a semiconductor device according to claim 10,
wherein after the step (d-2), a second bonding layer formed by second hydrogen bond and second ionic bond is formed between the wire portion and the lead made of third copper.

12. The method of manufacturing a semiconductor device according to claim 11,
wherein after the step (d-3), a second metallic bond layer made of second copper atoms of the second copper and third copper atoms of the third copper is formed between the wire portion and the lead.

13. The method of manufacturing a semiconductor device according to claim 1, further comprising the step of:
(e) between the step (c) and the step (d), performing plasma cleaning processing on a surface of the pad electrode.

14. The method of manufacturing a semiconductor device according to claim 1, further comprising the step of:
(f) after the step (d), sealing the semiconductor chip, the lead, and the wire with a resin.

15. A method of manufacturing a semiconductor device, the method comprising the steps of:
(a) preparing a semiconductor chip having a plurality of pad electrodes made of first copper, on a main surface of the semiconductor chip;
(b) preparing a base material having a chip mounting portion and a plurality of leads made of second copper;
(c) mounting the semiconductor chip in the chip mounting portion; and
(d) sequentially coupling the pad electrodes and the leads together by using a wire which is made of third copper and has a ball portion and a wire portion,
wherein the step (d) includes the steps of
(d-1) exposing the wire, the pad electrodes, and the leads to a reducing gas atmosphere, forming a first hydroxyl layer on a surface of the ball portion, forming a second hydroxyl layer on surfaces of the pad electrodes, forming a third hydroxyl layer on a surface of the wire portion, and forming a fourth hydroxyl layer on surfaces of the leads,
(d-2) a first bonding step of joining the ball portion to one of the pad electrodes through the first hydroxyl layer and the second hydroxyl layer,
(d-3) a second bonding step of bonding the wire portion to one of the leads through the third hydroxyl layer and the fourth hydroxyl layer,
(d-4) repeatedly performing the first bonding step and the second bonding step and sequentially bonding the pad electrodes and the leads together, and
(d-5) after the step (d-4), performing a heat treatment on the semiconductor chip and the base material, joining the ball portion to one of the pad electrodes, and joining the wire portion to one of the leads.

16. The method of manufacturing a semiconductor device according to claim 15,
wherein after the step (d-2), a first bonding layer famed by first hydrogen bond and first ionic bond is formed between the ball portion and the one of the pad electrodes, and
wherein after the step (d-3), a second bonding layer formed by second hydrogen bond and second ionic bond is formed between the wire portion and the one of the leads.

17. The method of manufacturing a semiconductor device according to claim 15,
wherein after the step (d-4), a first metallic bond layer made of first copper atoms of the first copper and third copper atoms of the third copper is formed between the pad electrode and the ball portion, and a second metallic bond layer made of second copper atoms of the second copper and the third copper atoms is formed between the lead and the wire portion.

18. The method of manufacturing a semiconductor device according to claim 15,
wherein the step (d-5) is performed in a state which the base material where the semiconductor chip is mounted is put in a chamber.

19. The method of manufacturing a semiconductor device according to claim 15,
wherein in the step (d-1), a guide hole of a capillary is filled with the reducing gas atmosphere, and the fourth hydroxyl layer is formed by inserting the wire into the guide hole.

* * * * *